(12) United States Patent
Kirczenow

(10) Patent No.: US 6,355,953 B1
(45) Date of Patent: Mar. 12, 2002

(54) SPINTRONIC DEVICES AND METHOD FOR INJECTING SPIN POLARIZED ELECTRICAL CURRENTS INTO SEMICONDUCTORS

(75) Inventor: George Kirczenow, Burnaby (CA)

(73) Assignee: Simon Fraser University, Burnaby (CA)

( * ) Notice: Subject to any disclaimer, the term of this patent is extended or adjusted under 35 U.S.C. 154(b) by 0 days.

(21) Appl. No.: 09/679,603

(22) Filed: Oct. 5, 2000

Related U.S. Application Data

(60) Provisional application No. 60/218,131, filed on Jul. 14, 2000, and provisional application No. 60/212,646, filed on Jul. 19, 2000.

(51) Int. Cl.$^7$ .............................................. H01L 29/76
(52) U.S. Cl. ...................................... 257/295; 257/75
(58) Field of Search .................................. 275/75, 295

*Primary Examiner*—FetsUm Abraham
(74) *Attorney, Agent, or Firm*—Oyen Wiggs Green & Mutala

(57) ABSTRACT

Atomically ordered interfaces between semiconductor and ferromagnetic materials provide spin filters. The spin filters may be used to inject strongly spin polarized currents into a semiconductor for use in spintronic devices. Some suitable combinations of ferromagnetic metal and semiconductor include hcp Co or fcc Ni or fcc Co (ferromagnetic metals) interfaced to GaSb, InAs, ZnTe, CdSe or GaAs or InP or Ge or BN or semiconductor alloys that include any of these (semiconductors).

47 Claims, 5 Drawing Sheets

SPINTRONIC DEVICES AND METHOD FOR INJECTING SPIN POLARIZED ELECTRICAL CURRENTS INTO SEMICONDUCTORS

CROSS REFERENCE TO RELATED APPLICATIONS

This application claims the benefit of the filing dates of U.S. application Ser. No. 60/218,131 filed Jul. 14, 2000 and U.S. application Ser. No. 60/212,646 filed Jun. 19, 2000, both entitled SPIN FILTERS THAT INJECT STRONGLY SPIN POLARIZED ELECTRON CURRENTS FROM FERROMAGNETIC METALS INTO SEMICONDUCTORS, FOR USE IN SPINTRONIC DEVICES.

TECHNICAL FIELD

This invention relates to spintronic devices. The invention relates particularly to methods and apparatus for injecting strongly spin-polarized electron currents into semiconductors and to electronic devices which operate according to such methods.

BACKGROUND

A spintronic device is a device in which the behaviour of charge carriers, most typically electrons, is spin-dependent. There are many applications for spintronic devices. Some examples of spintronic devices are the family of devices which exploit giant magnetoresistance (GMR). Spintronic devices may be used, for example, in magnetic field sensors, magnetic memories, spin-based transistors, semiconductor quantum interference devices based on electron spin, classical and quantum computers, heads for reading data from magnetic storage media or the like.

An impediment to the availability of commercially useful spintronic device is that it has so far not been practical to generate strongly spin-polarized currents in semiconductor materials. Spin-polarized currents of electrons can be generated in ferromagnetic materials because the magnetic field of the material (augmented by many-body effects) interacts with the spins of electrons. Thus the spin-up and spin-down states of electrons in a ferromagnetic material have different energy levels. The majority of electrons are in states such that their spins are aligned with the local magnetic field of the material. In such materials electrons occupy the majority and minority spin states asymmetrically.

It is possible, in principle, to take advantage of this asymmetry to create a spin-polarized current in a non-ferromagnetic material by creating a spin-polarized electron current in a ferromagnetic material and causing the current to flow from the ferromagnetic material into an adjacent non-ferromagnetic material by way of an interface. Spin-polarized electron transport has been achieved in this way from ferromagnetic metals into to superconductors (see R. Meservey et al. Phys. Rev. Lett. 25, 1270 (1970)) from ferromagnetic metals into normal metals (see M. Johnson et al. Phys. Rev. Lett. 55, 1790 (1985)), between two ferromagnetic metals separated by a thin insulating film (See M. Julliere Phys. Lett. 54A, 225 (1975))and from magnetic semiconductors into non-magnetic semiconductors (see R. Fiederling et al. Nature 402, 787 (1999) and Y. Ohno et al. Nature 402, 790 (1999)). Although it has long been recognized as an important goal of solid state physics and technology to inject strongly spin-polarized electron currents from ferromagnetic metals into semiconductors this goal has not been achieved.

The best that has been reported to date is the injection of weakly spin-polarized electron currents from ferromagnetic metals into semiconductors (see W. Y. Lee et al. J. Appl. Phys. 85,6682 (1999) and P. R. Hammar et al. Phys. Rev. Lett. 83, 203, (1999). It is not clear that the experimental data presented in these reports establishes conclusively that even weakly spin-polarized currents were successfully injected into the semiconductor (see, for example, F. G. Monzon et al. Phys Rev. Lett. 84, 5022 (2000), B. J. van Wees Phys. Rev. Lett 84, 5023 (2000), and P. R. Hammar et al. Phys. Rev. Lett 84, 5024 (2000)).

It has been suggested that, for devices in the diffusive transport regime, the best that can be achieved, even in principle, is to inject a weak (<0.1%) spin-polarization of electrons from a ferromagnetic metal into a semiconductor (unless the ferromagnetic contact is almost 100% spin polarized, which is not the case for standard ferromagnetic metals such as Fe, Co, Ni and permalloy that are commonly used in devices) (See, for example, G. Schmidt et al. Phys. Rev. B. Vol. 62, pp. R4790–R4793 (2000). The basis for this suggestion is that, in an electric circuit comprising a diffusive semiconductor in series with a metal, the net resistance of the circuit should be dominated by the spin-independent resistance of the semiconductor. Therefore, the spin-up and spin-down currents flowing through the semiconductor should be almost equal.

M. Johnson has suggested that it might be possible to inject spin-polarized electrons from ferromagnetic metals into semiconductors in a manner based on the Rashba effect in quasi-two-dimensional electron gases. It is not clear that this can be practically achieved.

There is a need for methods and systems for injecting strongly spin polarized currents into semiconductors for use in various spintronic devices.

SUMMARY OF THE INVENTION

This invention provides methods and apparatus which create a spin filter at an interface between a semiconductor and a ferromagnetic material. The spin filter can be used to provide a current of spin-polarized charge carriers in the semiconductor.

One aspect of the invention provides a spintronic device which comprises a crystalline first semiconductor; and a crystalline ferromagnetic material in atomic registration with the first semiconductor at an interface. The semiconductor and ferromagnetic material are chosen so that transmission of charge carriers in a first spin state from the ferromagnetic material into the first semiconductor is quantum mechanically forbidden while the transmission of charge carriers in a second spin state from the ferromagnetic material into the first semiconductor is quantum mechanically permitted.

Where the first semiconductor is an n-type semiconductor, the charge carriers are electrons in the semiconductor and a projection of a Fermi surface of either majority or minority spin electrons in the ferromagnetic material is not connected to a projection of any wave vector of a lowest conduction band minimum of the first semiconductor by the projection of any sum of reciprocal lattice vectors of the first semiconductor, ferromagnetic material and interface. "Projection" means "projection onto the plane of the interface".

Where the first semiconductor is a p-type semiconductor, the charge carriers are holes in the semiconductor and a projection of a Fermi surface of either majority or minority spin electrons in the ferromagnetic material is not connected to a projection of any wave vector of a valence band maximum of the first semiconductor by the projection of any sum of reciprocal lattice vectors of the first semiconductor, ferromagnetic material and interface.

Another aspect of the invention provides a method for injecting a spin-polarized current into a semiconductor. The method comprises providing a semiconductor crystal in atomic registry with a crystal of a ferromagnetic material at an interface wherein transmission of charge carriers in a first spin state from the ferromagnetic material into the first semiconductor is quantum mechanically forbidden while the transmission of charge carriers in a second spin state from the ferromagnetic material into the first semiconductor is quantum mechanically permitted; and, applying a bias voltage across the interface.

Further features and advantages of the invention and specific embodiments of the invention are described below.

BRIEF DESCRIPTION OF THE DRAWINGS

In figures which illustrate non-limiting embodiments of the invention.

DESCRIPTION

Figure 1:
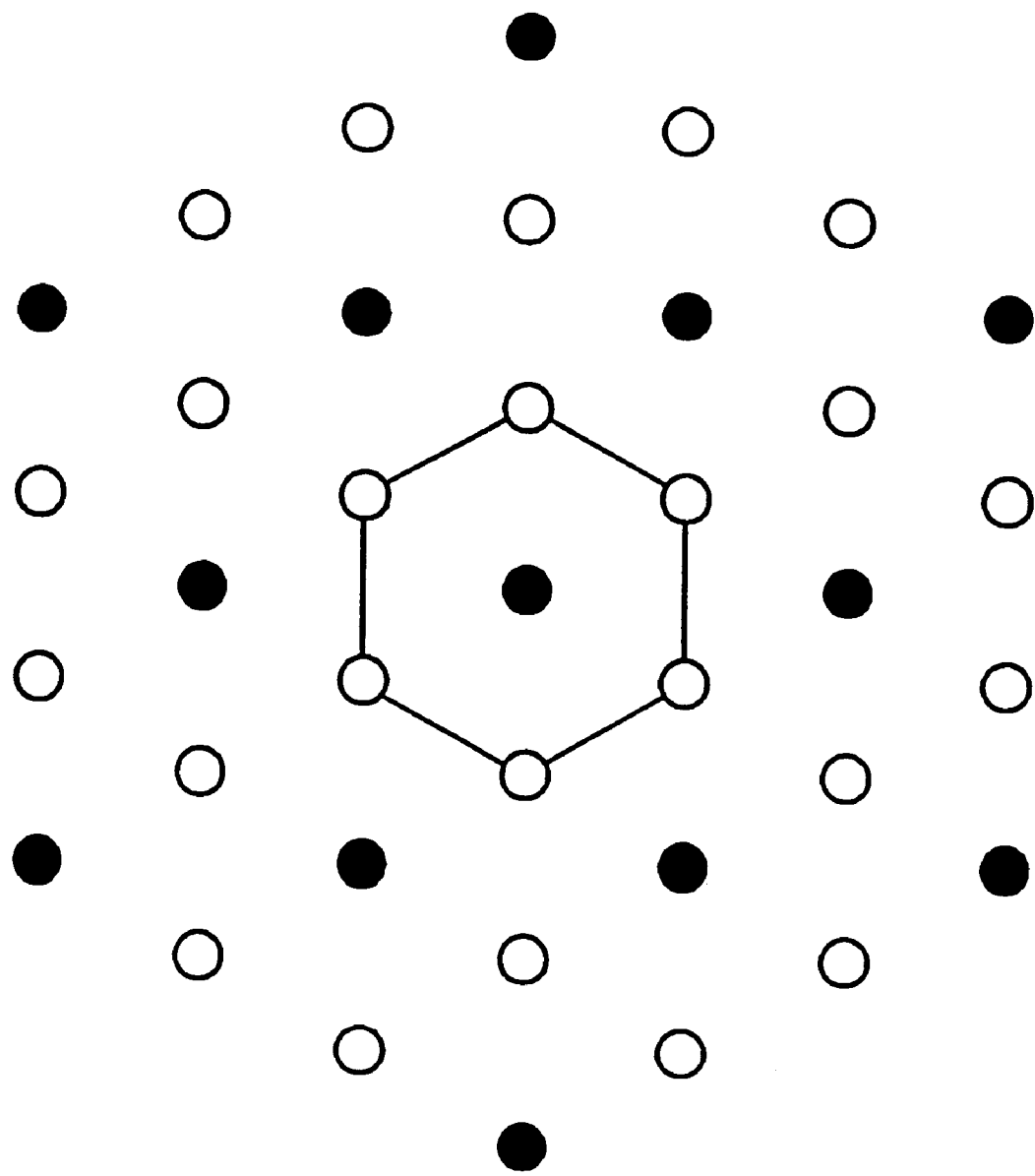
FIG. 1 is a diagram illustrating reciprocal lattice vectors of a ferromagnetic material and a semiconductor which are in atomic registration at a planar interface projected onto the plane of the interface.

This invention introduces spin-polarized electric currents and/or spin-polarized electrons or holes into semiconductor materials by creating an interface at which spin-dependent transmission of electrons occurs. The interfaces are atomically ordered interfaces between suitable semiconductors and suitable ferromagnetic materials. In devices according to the invention, interfaces between ferromagnetic materials and semiconductors are constructed so that the transmission of charge carriers in a first spin state from the ferromagnetic material into the semiconductor is much more likely to occur than the transmission of charge carriers in a second spin state from the ferromagnetic material into the semiconductor. Preferably the transmission of charge carriers in the first spin state from the ferromagnetic material into the semiconductor is quantum mechanically forbidden while the transmission of charge carriers in the second spin state from the ferromagnetic material into the semiconductor is quantum mechanically permitted. In this case the interface between the ferromagnetic material and the semiconductor functions as a nearly perfect spin filter. In a nearly-ideal spin filter the transmission of charge carriers in the second spin state from the ferromagnetic material into the semiconductor can occur with a much higher probability than the transmission of charge carriers in the first spin state from the ferromagnetic material into the semiconductor so that an electric current passing through the interface will contain many more charge carriers in the second spin state than in the first spin state.

Interfaces which function as spin filters according to the invention can be understood with reference to three characteristics of the manner in which electrons behave in crystalline materials as follows:

When an electron crosses a plane, defect-free interface between two crystals that are in atomic registry with one another at the interface, the component of its Bloch state wave vector that is parallel to the plane of the interface is conserved modulo projections of sums of certain reciprocal lattice vectors onto the plane of the interface (unless otherwise specified, the term 'projection' in this disclosure means 'projection onto the plane of the interface'). The set of reciprocal lattice vectors, any of which may contribute to the sum mentioned in the preceding sentence, includes the reciprocal lattice vectors of the two crystals and also the reciprocal lattice vectors that are associated with the group of symmetry translations (parallel to the interface plane) of the whole system consisting of the two crystals and the interface between them.

If a bias voltage is applied to an interface across which electrons can pass then an electric current will pass through the interface. The electrons which make up the electric current can be described in terms of electrons that scatter through the interface from the vicinity of the Fermi surface of one of the crystals to the vicinity of the Fermi surface of the other crystal.

The Fermi surface of an n-type semiconductor is confined to only small regions of reciprocal space surrounding the lowest conduction band minima of the semiconductor. In a p-type semiconductor the Fermi surface is confined to small regions of the reciprocal space surrounding the highest valence band maxima of the semiconductor.

Consider the ideal case of a crystalline n-type semiconductor joined to a crystal of a ferromagnetic material at a defect-free, planar interface such that there is atomic registry between the crystal of semiconductor and the crystal of ferromagnetic material at the interface. A small bias voltage is applied across the interface so that electrons from the ferromagnetic material are urged toward the semiconductor. If no spin-flip scattering occurs at the interface, and the projection of the Fermi surface of the majority spin electrons of the ferromagnetic material is not connected to the projection of the wave vector of a lowest conduction band minimum of the semiconductor by the projection of a sum of reciprocal lattice vectors (as described above) then the majority spin electrons in the ferromagnetic material (which are at the Fermi energy) will be reflected perfectly by the interface. No net current of majority spin electrons will be driven through the interface by the bias voltage.

If the transmission of minority spin electrons from the ferromagnetic material to the semiconductor at the Fermi energy is allowed then the interface will act as a perfect 'spin filter' and a 100% spin-polarized electric current will flow from the ferromagnetic material into the semiconductor. This is true even if those electrons in the ferromagnetic material which are at the Fermi energy are only partially spin-polarised. In real materials the interfaces will not be completely free from defects and are not infinite in extent. Therefore, real devices will typically function, at best, as nearly ideal spin filters.

In real devices which operate at temperatures above absolute zero the Fermi surface (which, at a temperature of absolute zero is theoretically sharp and separates unfilled atomic orbitals from filled orbitals) will be somewhat diffuse, or "blurred". This is because, due to thermal excitation, some electrons will populate orbitals which would be unfilled at a temperature of absolute zero. This blurring is particularly significant in semiconductors at temperatures approaching or exceeding room temperature. In real devices the bias voltage may be large enough to permit electrons to scatter across the interface from states which are near, but not at, the Fermi surface. These factors also prevent real devices from functioning as "perfect" spin filters. Nevertheless, such devices can still function as nearly ideal spin filters as long as the a projection of a Fermi surface of majority (or minority) spin electrons in the ferromagnetic material is not nearly connected to a projection of any wave vector of a conduction band minimum (or valence band maximum in the case of a p-type semiconductor) of the first semiconductor by the projection of any sum of reciprocal lattice vectors of the first semiconductor, ferromagnetic crystal and entire system consisting of the first semiconductor ferromagnetic crystal and interface.

n-type semiconductors are generally regarded as better candidates for use in spintronic devices than are p-type semiconductors because, in most semiconductors (a notable exception being boron-nitride), the valence band is strongly affected by spin-orbit coupling. Spin-orbit coupling provides a mechanism by which valence band electrons can change their spin states as a result of interactions with the crystal lattice which they are entering. In a p-type material majority carriers are in the valence band. Therefore a spin-polarized current in a p-type semiconductor material for which valence-band electrons are significantly affected by spin-orbit coupling are not preferred for use in this invention as, in such materials electrons will tend to lose any spin polarization as they change their spin states. If the semiconductor is a p-type material then the invention may be practised by making an interface in which the projection of the wave vector of a valence band maximum of the semiconductor is not connected to the projection of the Fermi surface of majority spin electrons of the ferromagnetic material by the projection of a sum of reciprocal lattice vectors.

The invention may also be practised by providing interfaces which block the passage of minority spin electrons from the ferromagnetic material and allow majority spin electrons to pass into the semiconductor.

The operation of the invention may be understood with reference to FIG. 1 which shows as circles the projections onto the plane of an interface of the reciprocal lattice vectors of a semiconductor having a zinc blende structure as is described in Example I below. The filled circles also correspond to projections onto the plane of the interface of reciprocal lattice vectors of a ferromagnetic crystal having a lattice spacing and orientation matched to that of the semiconductor as described in Example I.

The semiconductor and ferromagnetic material have crystal structures that are in atomic registry with one another at the interface. Therefore, the filled circles correspond to projected reciprocal lattice vectors of both the ferromagnetic material and the semiconductor. The open and filled circles also indicate the reciprocal lattice vectors that are associated with the group of symmetry translations (parallel to the interface plane) of the whole system consisting of the two crystals and the interface between them. The hexagon (shown for reference) is the projection of the boundary of the first Brillouin zone of hcp Co onto the interface plane.

For a direct gap n-type semiconductor whose conduction band minimum is located at the center of the Brillouin zone (as it is for the above-noted semiconductors) the open and filled circles also indicate the locations of the replicas of the conduction band minimum in the repeated zone scheme. The ferromagnetic material might be, for example, hcp Co, fcc Ni, or fcc Co. The Fermi surfaces of these materials have been studied (for example, see D. A. Papaconstantopoulos et al, *Handbook of the band structure of elemental solids,* Plenum Press, New York, (1986)). The projection of the Fermi surface of the majority spin electrons in each of these materials onto the interface plane does not overlap any of these replicas of the semiconductor conduction band minimum for the interfaces described in Example 1. This is not true for the Fermi surfaces of the minority spin electrons. Therefore only minority spin electrons can be transmitted through the interface at the Fermi energy if there is perfect atomic registry at the interface and, the interface is oriented as is described in Example 1, the interface is defect-free.

This can be explained more comprehensively as follows. Consider an atomically ordered plane interface between two crystals, a semiconductor S and a ferromagnetic metal M. Far from the interface the periodicities of the two crystals are described by their three-dimensional sets of Bravais lattice vectors $\{R_S\}$ and $\{R_M\}$, respectively. The periodicity of the entire system (consisting of the two crystals and the interface) is described by a two-dimensional Bravais lattice of symmetry translations $\{R_I\}$ parallel to the plane of the interface. The corresponding three and two-dimensional reciprocal lattices for semiconductor S ferromagnetic metal and entire system are the sets of vectors $\{K_S\}\{K_M\}$ and $\{K_I\}$ respectively.

Because the entire system is symmetrical under the set of translations $\{R_I\}$ parallel to the plane of the interface, a set of one-electron energy eigenstates of the entire system can be expressed in the Bloch form:

$$\psi_{k_I s}(r) = e^{i k_I \cdot r} u_{k_I s}(r) \qquad (1)$$

where r is the position of the electron, $k_I$ is a vector parallel to the plane of the interface, and u can be written in the form:

$$u_{k_I s}(r) = \sum_{K_I} \Lambda_{K_I}^{k_I s}(r_\perp) e^{i K_I \cdot r} \qquad (2)$$

where $r\perp$ is the component of r in the direction orthogonal to the plane of the interface. The states $\psi_{k_I s}$ include among them the scattering states of electrons that are incident on the interface from the ferromagnetic metal crystal at the Fermi energy and are partly or completely transmitted and/or reflected at the interface. Deep in the ferromagnet these scattering states can be written as linear combinations of the Bloch states $\psi_{k_M s}$ of the three-dimensional ferromagnetic metal crystal at the Fermi energy. Therefore, inside and away from the boundaries of the ferromagnet, $$\Psi_{k_I s}(r) = \sum_{k_M, s} A_{k_M s}^{k_I s} \Psi_{k_M s}(r) \qquad (3)$$

The Bloch states $\psi_{k_M s}$ of the ferromagnet can be written in Fourier form as:

$$\Psi_{k_M s}(r) = \sum_{K_M} \lambda_{K_M}^{k_M s} e^{i(k_M + K_M) \cdot r} \qquad (4)$$

Combining equations (1), (3) and (4) yields:

$$\sum_{K_I} \Lambda_{K_I}^{k_I s}(r_\perp) e^{i(K_I+k_I)\cdot r} = \sum_{k_M, K_M, s} A_{K_M s}^{k_I s} \lambda_{K_M}^{k_M s} e^{i(K_M+k_M)\cdot r} \quad (5)$$

for r deep in the ferromagnet. Equation (5) can only be satisfied for all r deep in the ferromagnet if, for some $k_M$ on the Fermi surface of the ferromagnet and for some reciprocal lattice vectors $K_I$ and $K_M$:

$$k_I = (k_M + K_M)_I - K_I \quad (6)$$

where( . . . )$_I$ indicates the projection of the vector quantity in brackets onto the plane of the interface. The foregoing analysis can be repeated for points deep in the semiconductor expressed in terms of the semiconductor's Bloch states to yield:

$$k_I = (k_S + K_S)_I - K'_I \quad (7)$$

where $k_S$ is a vector on the Fermi surface of the semiconductor and $K'_I$ is a vector of the two-dimensional reciprocal lattice of the entire system. Both of equations (6) and (7) must be satisfied for transmission of an electron from the ferromagnet into the semiconductor. Therefore, for transmission of electrons to occur from the ferromagnet into the semiconductor, the following relationship should hold:

$$(k_S)_I = (k_M)_I + (K_M - K_S)_I - K_I + K'_I \quad (8)$$

Equation (8) can be expressed as the transmission rule which is set out above, namely, under ideal conditions, transmission of electrons from the majority or minority spin bands of the ferromagnetic material into the semiconductor (and vice-versa) is forbidden unless the projections of the Fermi surfaces of the semiconductor and of the majority or minority spin bands of the ferromagnetic material are connected by a vector that is the sum of one or more of reciprocal lattice vectors of the entire system, projections onto the interface plane of reciprocal lattice vectors of the semiconductor and projections onto the interface plane of reciprocal lattice vectors of the ferromagnetic material.

This invention provides methods for creating a situation wherein condition (8) is satisfied for minority spin electrons in the ferromagnet, but not for majority spin electrons in the ferromagnet, or vice versa and to devices in which this is the case.

In a real device there will be some defects in the ferromagnetic material, the semiconductor and/or the interface. Such defects (if they are at or close to the interface) will likely scatter from the ferromagnetic material into the semiconductor some electrons which have a spin state (either majority spin or minority spin) such that the electrons would otherwise be blocked. Therefore, the electric current injected into the semiconductor will not be 100% spin-polarized. It is desirable that the interface be as free as possible from defects and especially from intermixing between the metal and semiconductor. Nevertheless, if the number of defects is relatively small or the defects are of a type which is benign in the sense that they do not permit large numbers of the otherwise blocked electrons to pass through the interface into the semiconductor, or both then the injected current will still be strongly spin-polarized.

It is important to match the lattice spacings of the ferromagnetic material and the semiconductor so that the two materials are in good atomic registration at the interface. Most preferably, the ratio in lattice spacings, or atomic spacings in the atomic planes adjacent to the interface, between the semiconductor material and the ferromagnetic material is one of: 1:1; 1:√2; √2:1; 1:√3; √3:1; 1:2; or 2:1. The match in the plane of the interface between the lattice parameters of the semiconductor and ferromagnetic materials should generally be better than 10%, is preferably better than 5%, is more preferably better than 2%, and is most preferably better than 1%.

In this disclosure, two materials are in "atomic registration" with one another at a planar interface when the first material can be translated relative to the second material in the plane of the interface with a set of translations which is a sum of lattice vectors of the first material and, after any translation in the set, the atoms of the first material will each be in the same position relative to atoms in the second material as they were before the translation. Two materials are in atomic registration with one another even if the foregoing is not true at locations where there are defects in the crystal structure of one of the materials. As is known to those skilled in the art, two materials may be considered to be in atomic registration with one another even if there is not perfect matching between their lattice parameters because the atoms in one material will tend to stretch apart or be drawn together slightly so that they will line up with atoms of the second material in a particular way. As a result, if the mismatch is not too big, the atoms of the two materials will line up essentially exactly in large areas of the interface. Between these areas will be dislocations which may act as defects which can transmit some electrons across the interface which would be blocked if the match between the materials were perfect. In general, to practice this invention the interface should be atomically ordered (or nearly atomically ordered), the interface should be periodic (or nearly periodic) under a set of translations parallel to the plane of the interface, and the periodicity should be such that the reciprocal lattices of the two materials, their Fermi surfaces, and the reciprocal lattice of the system as a whole meet, or nearly meet, the mathematical conditions for ideal spin filters which are described above.

The lattice parameter of the semiconductor or the ferromagnetic material, or of both the semiconductor and the ferromagnetic material may be adjusted for a better match by alloying the semiconductor or ferromagnetic material with small concentrations of similar species. For example isoelectronic species may be alloyed with semiconductors such as GaSb, InAs, ZnTe, CdSe, GaAs, InP or Ge to improve the accuracy of the lattice matching to a particular ferromagnetic material at an interface. Alloying a semiconductor with other elements introduces some random defects. Doping of the semiconductors also introduces random defects. Doping is used to make the semiconductors n-type or p-type and to help suppress Schottky barriers as is well known in the art. In either case, it is generally possible to keep the defect concentration low relative to that of the semiconductor species so that such doping should be tolerable in these devices, especially if there is a dopant-free spacer region immediately adjacent to the interface.

Figure 2A:
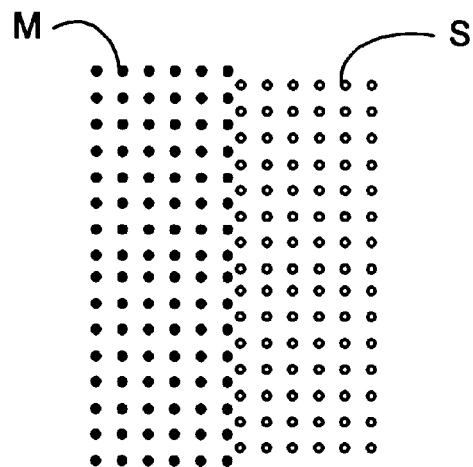
FIGS. 2A and 2B are schematic views of interfaces between ferromagnetic materials and semiconductor materials in spintronic devices according to the invention.
Figure 2B:
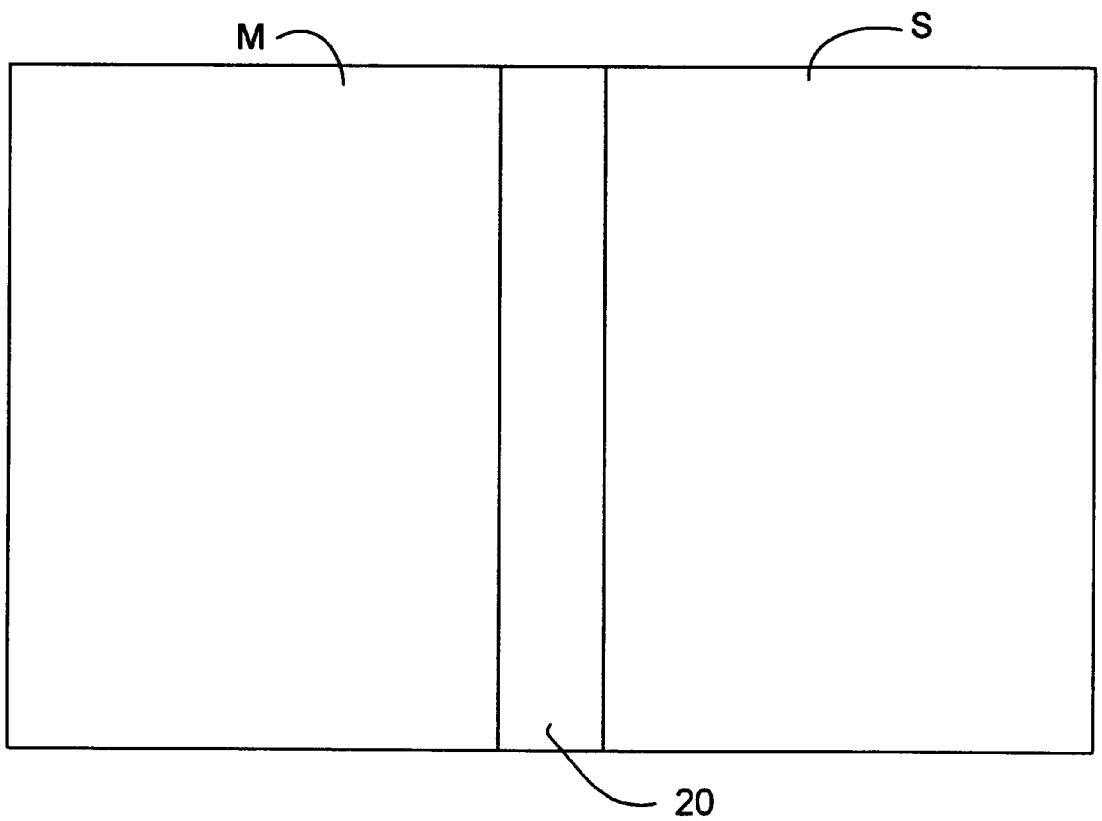

While the interface may involve direct contact between the ferromagnetic material M and semiconductor S, as shown in FIG. 2A, the interface may include one or more intermediate ordered layers 20 of other atomic species between semiconductor S and metal M as shown in FIG. 2B. Intermediate ordered layers 20 should be in atomic registry with ferromagnetic material and semiconductor and may comprise different atomic species than those present in S and M and/or the same species in a different spatial arrangement. The intermediate layers, when present, are understood to be a part of the interface in the mathematical analysis of ideal spin filters presented above. Providing one or more intermediate ordered layers 20 may permit an interface which is more nearly perfectly ordered than would otherwise be achievable between some pairs of ferromagnetic and semiconductor materials. Such an intermediate layer may also help to reduce the size of Schottky barriers at the interface.

Figure 5:
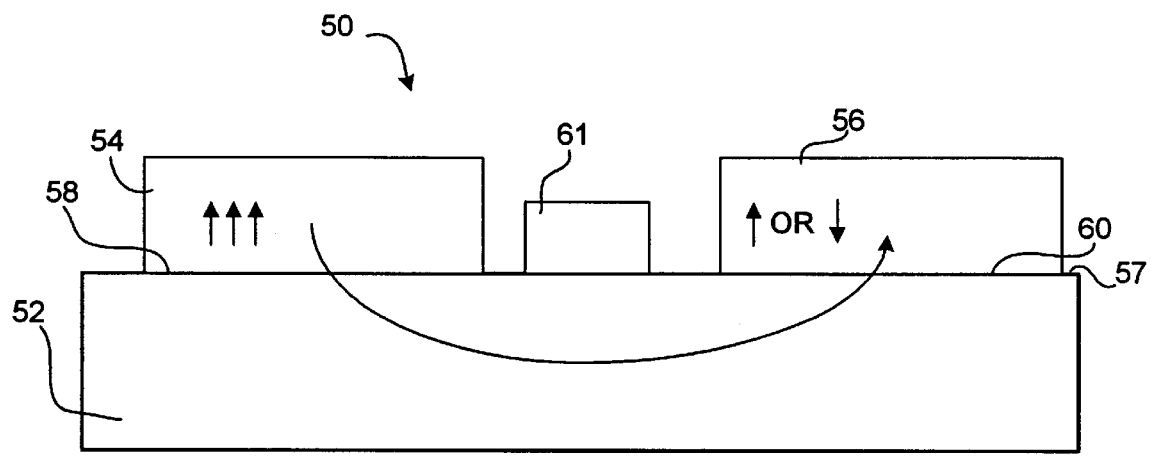
FIG. 5 is a spin-valve transistor according to one specific embodiment of the invention; and, FIG. 6 shows a section through a spin valve according to an embodiment of the invention.

It can be appreciated that this invention makes it possible to create devices which use ordinary ferromagnetic metals, such as Co and Ni, to achieve injection of strongly spin-polarized electrons (with up to 100% spin polarization) into semiconductors. Another feature of the invention is that an interface which blocks the flow of spin-polarized electrons from a ferromagnetic material into a semiconductor also blocks the flow of electrons having the same spin polarization from the semiconductor into the ferromagnetic material. This feature may be used to make spin valves. Spin valves could be used, inter alia, in spin-valve transistors. Spin-valve transistors have been proposed in the literature. However, no one has yet been able to implement such a transistor that operates by injection of spin-polarized carriers from a ferromagnetic metal to a semiconductor because practical spin filters of this type have not been available. FIG. 5 shows a spin-valve transistor 50 according to one embodiment of the invention. Transistor 50 comprises a layer 52 of a semiconductor having two regions 54, 56 of ferromagnetic material deposited on its surface 57. The semiconductor/ferromagnetic material interfaces 58, 60 are constructed to perform as spin filters according to the invention. Spin filtering according to the invention can occur in either direction through an interface. If the ferromagnetic materials of layers 54 and 56 have parallel magnetization then electrons whose spin orientation permits them to pass into semiconductor layer 52 through interface 58 will also be able to pass from semiconductor layer 52 into ferromagnetic layer 56 through interface 60. An electron current can therefore flow through transistor 50. A gate electrode 61 permits the electron current to be controlled. If the magnetization of the ferromagnetic material in layer 56 is antiparallel to the magnetization of the ferromagnetic material in layer 54 then electrons which enter semiconductor layer 52 at interface 58 will be blocked at interface 60 and vice versa. If one of the layers of ferromagnetic material is thinner than the other layer then one way to switch transistor 50 between its on and off states is by applying an external magnetic field to transistor 50.

Figure 6:
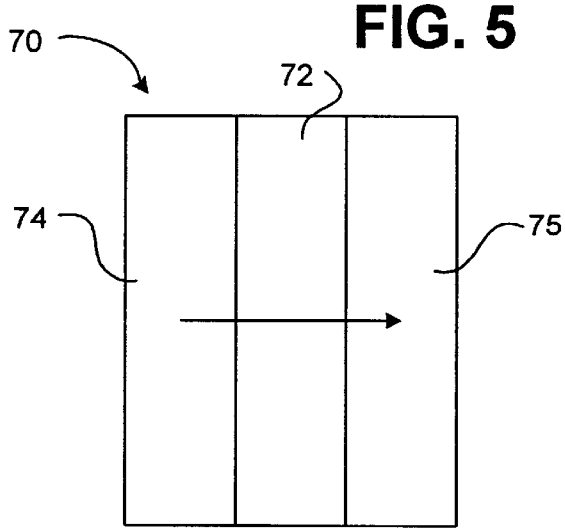

As shown in FIG. 6, a spin valve 70 according to the invention might also be made by sandwiching a layer of semiconductor material 72 between layers of ferromagnetic material 74, 75 with a spin-filtering interface between the semiconductor and each layer of ferromagnetic material.

It may be desirable to inject a spin polarized electron current into a semiconductor material which has a lattice spacing and/or Fermi surface which is not compatible with creating an interface with near-ideal spin filtering properties between the semiconductor material and a particular ferromagnetic material. The spin-polarization of the current injected into a semiconductor should not be sensitive to the presence of non-magnetic defects that are not in the immediate vicinity of the semiconductor/ferromagnetic material interface. Thus, a strongly spin-polarized current may be injected through an atomically ordered interface into a first semiconductor material (wherein the first material does have a lattice parameter and Fermi surface compatible with the ferromagnetic material). The current can then be carried into a second semiconductor material without seriously degrading the strength of the spin-polarization. The interface between the first and second semiconductor materials does not need to be atomically ordered and may even be disordered. This construction may be used, for example, to inject spin-polarized currents into silicon semiconductor devices.

EXAMPLE 1

Co or Ni with a Direct Gap Semiconductor

The semiconductor may be a direct-gap semiconductor (which may be an n-type semiconductor having a conduction band minimum lying at the center of the Brillouin zone or a p-type semiconductor having a valence band maximum lying at the center of the Brillouin zone). In this case, the ferromagnetic material should have the property that the projection onto the interface of the Fermi surface for the majority-spin electrons should not overlap the projection of the center of the Brillouin zone (k=0) of the semiconductor and the projection of the Fermi surface of the minority-spin electrons does overlap the projection of the center of the Brillouin zone (or vice versa). Furthermore, the projection of the Fermi surface of the ferromagnetic material onto the interface plane should not overlap with the projection of any of the reciprocal lattice vectors of the semiconductor material onto the plane of the interface. Some common ferromagnetic materials for which these conditions hold include:

hcp Co for interfaces orthogonal to the (001) crystallographic axis;

fcc Ni for interfaces perpendicular to the (111) crystallographic axis; and, fcc Co for interfaces perpendicular to the (111) crystallographic axis.

The ferromagnetic material should have a lattice parameter of a size which permits formation of an interface in atomic registry with the selected semiconductor. The interface is between a (111) crystallographic face of the semiconductor for semiconductors with the zinc blende crystal structure (or a hexagonal face of a semiconductor with the wurtzite structure) and a (111) crystallographic face of the ferromagnetic metal in the case of the above fcc metals, or a (001) crystallographic face, (i.e., a basal layer of hexagonally close packed atoms) of the ferromagnetic metal in the case of the hcp Co.

The (001) crystallographic planes of hcp Co and the (111) planes of fcc Ni and fcc Co comprise metal atoms in a hexagonal close-packed arrangement. The (111) atomic planes of semiconductors with the diamond and zinc blende crystal structures also have hexagonal atomic arrangements, but in most cases with considerably larger in-plane nearest neighbour atomic spacings than those of the metals. Direct gap semiconductors with the wurtzite structure also have planes of atoms in a hexagonal arrangement, and the in-plane nearest-neighbour spacings are again in most cases significantly larger than those of the metals. However, for many of these semiconductors, the in-plane nearest-neighbour atomic spacings are larger than those in the metals by factors close to $\sqrt{3}$. For such semiconductors approximate atomic registry between the hexagonal atomic planes of the metal and semiconductor can be achieved by a rotation of the metal Bravais lattice relative to that of the semiconductor through a 30° angle about the axis perpendicular to the plane of the interface.

Some suitable direct gap semiconductors having lattice parameters which permit atomic registry with the above ferromagnetic metals to a high degree of accuracy are listed in Tables I and II.

TABLE I

Semiconductors having zinc blende structures

| Name | match to hcp Co | match to fcc Ni | match to fcc Co |
|---|---|---|---|
| ZnTe | 1.006 | 1.000 | 1.006 |
| GaSb | 1.007 | 1.001 | 1.007 |
| InAs | 1.014 | 1.008 | 1.013 |
| CdSe | 1.015 | 1.009 | 1.014 |
| CuI | 1.016 | 1.010 | 1.016 |
| InP | 1.046 | 1.040 | 1.046 |
| InSb | 0.948 | 0.942 | 0.947 |
| CdTe | 0.947 | 0.941 | 0.946 |
| CdS | 1.054 | 1.048 | 1.054 |
| ZnSe | 1.083 | 1.077 | 1.083 |
| GaAs | 1.086 | 1.080 | 1.086 |

In each row of Tables I and II, the name of the semiconductor is followed by the ratios ap/a where ap is the lattice parameter required for a perfect match with a metal and a is the actual value of the lattice parameter for the semiconductor.

TABLE II

Semiconductors having wurtzite structures

| Name | match to hcp Co | match to fcc Ni | match to fcc Co |
|---|---|---|---|
| CdSe | 1.010 | 1.004 | 1.010 |
| CdS | 1.050 | 1.044 | 1.049 |

For an interface to function as a nearly ideal spin filter, an accurate lattice match is clearly desirable. In Tables I and II the accuracy of the lattice matching varies from excellent to marginal, depending on the materials involved. The match between the lattice parameter of the semiconductor and the lattice parameter of the ferromagnetic material may be improved by alloying different semiconductors, for example GaSb or InAs with InSb, at the expense of introducing random defects. Another way to improve the lattice matching is to grow very thin films (of the metal on the semiconductor or of the semiconductor on the metal) in which the metal and semiconductor are in perfect atomic registry with each other at the interface although the thin film is elastically strained. Suitable interfaces may be created, for example, by providing a properly oriented crystal of one of the above semiconductors and depositing a number of layers of ferromagnetic metal atoms by MBE (Molecular Beam Epitaxy).

In general, it is desirable to select combinations of the ferromagnetic material and the semiconductor material for which Schottky barriers at the interface is relatively low. Preliminary calculations indicate that the Schottky barriers at atomically ordered interfaces between Ni and n-type InAs; Co and n-type InAs; Ni and n-type CdSe; and Co and n-type CdSe are relatively low. As discussed above, intermediate layers may be provided at the interface to reduce Schottky barriers. Schottky barriers may be further reduced by selectively doping the semiconductor material.

EXAMPLE 2
AlSb with Co or Ni

AlSb is an indirect gap semiconductor with the zinc blende structure whose valence band maximum is at the center of the Brillouin zone. When doped as a p-type semiconductor it may also be used as a spin filter in conjunction with Ni or Co.

EXAMPLE 3
Hexagonal Boron Nitride with Co or Ni

The invention may be practised with indirect gap semiconductors wherein the conduction band minima (and/or valence band maxima) do not lie near the center of the Brillouin zone. An indirect gap semiconductor that satisfies the criteria for spin filters in conjunction with some ferromagnetic metals is hexagonal boron nitride ("h—BN"). h—BN has a layered structure (resembling graphite) with a hexagonal Bravais lattice. Its in-plane lattice parameter of 2.504Å is a very good match to the nearest-neighbour distances of 2.507 Å, 2.492 Å and 2.506 Å in the hexagonal atomic layers of hcp Co, fcc Ni and fcc Co, respectively. Because of this accurate lattice matching, monolayers of hexagonal boron nitride grown on (111) surfaces of fcc Ni are highly ordered and in atomic registry with the substrate. It is also worth noting that because BN consists of light atoms the effects of spin-orbit coupling in BN should be very weak.

Figure 3:
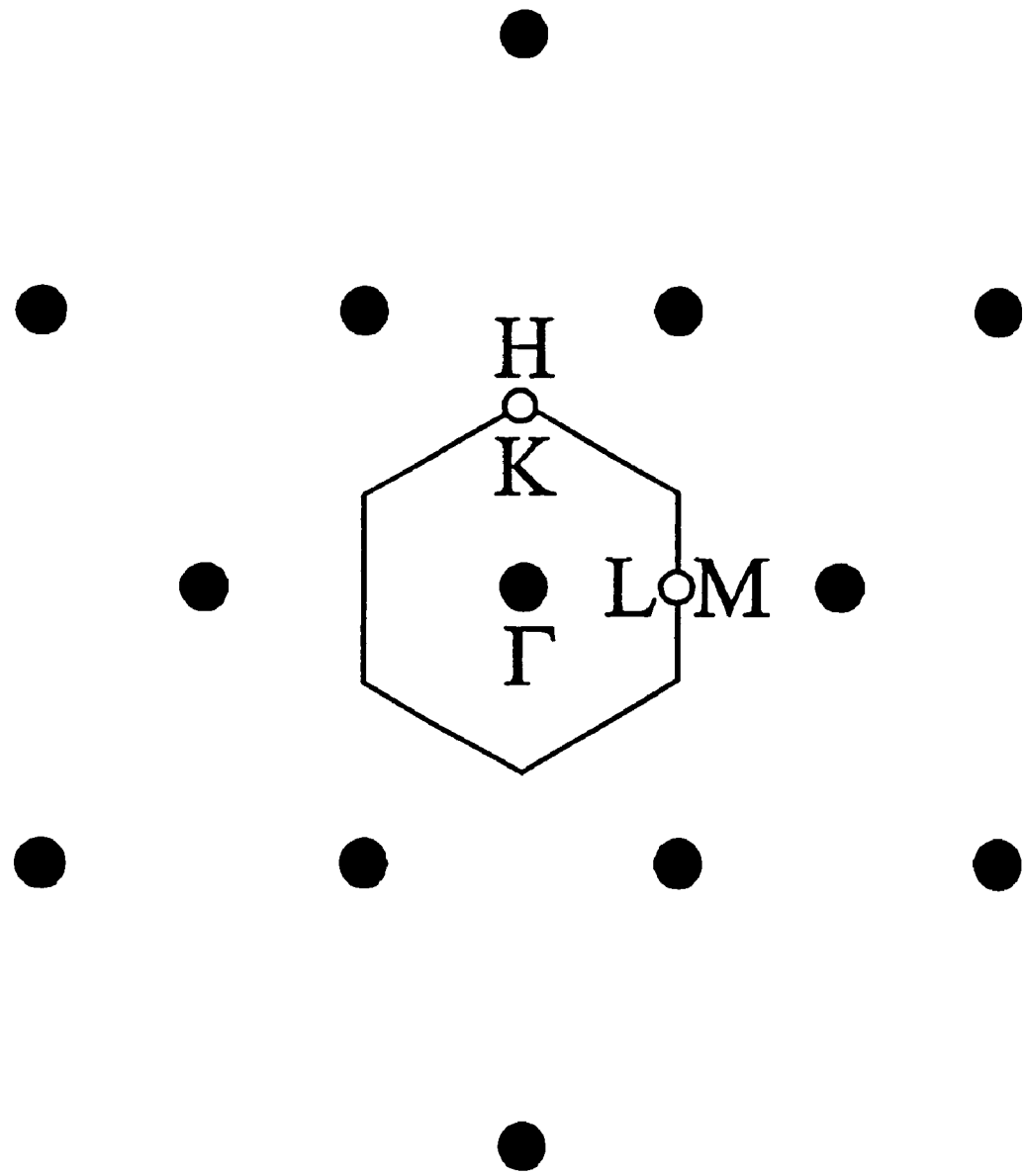
FIG. 3 is a diagram illustrating reciprocal lattice vectors of a crystal of a fcc or hcp ferromagnetic material at an interface with h—BN; and, FIG. 4 is a diagram illustrating the projection of the first Brillouin zone of $CoS_2$ onto an interface of a spintronic device according to the invention.

For fcc and hcp crystals in atomic registry at an interface with a hexagonal basal plane of h—BN, the projections of the reciprocal lattice vectors of the fcc or hcp crystals onto the interface coincide with the projections of the h—BN reciprocal lattice vectors onto the interface and are indicated by the filled circles in FIG. 3. The projections of the first Brillouin zones of the hcp crystal and of h—BN onto the interface are indicated by the hexagon in the FIG. 3. Recent band structure calculations (see, for example, A. Catellani et al., Phys. Rev. B32 6997 (1985); Y. N. Xu et al. Phys. Rev. B44, 7787 (1991); and H. Ma et al. J. appl. Phys. 73, 7422 (1993)) indicate that h—BN is an indirect gap semiconductor with the lowest conduction band minimum at M and the valence band maximum at H or K. The interface between a hexagonal atomic layer of hcp Co and a hexagonal basal plane of h—BN should be a near ideal spin filter for both n-type and p-type h—BN. The interface between a (111) atomic plane of fcc Ni or fcc Co and a hexagonal basal plane of h—BN should be a near ideal spin filter for p-type h—BN but not for n-type hBN. In each case, minority-spin band electrons are transmitted by the filter.

EXAMPLE 4
Boron Nitride with Co or Ni

While h—BN is the stable form of boron nitride under normal conditions, BN can also exist in forms which have zinc blende or wurtzite crystal structures. Band structure calculations have been performed for those systems (See Y. N. Xu et al. Phys. Rev. B44, 7787 (1991)). Both the zinc blende and wurtzite forms of BN are indirect gap materials with the valence band maximum at Γ. The conduction band minima are at X for the zinc blende form and at K for the wurtzite form. The hexagonal atomic planes of these materials have lattice parameters which match reasonably well to the hexagonal atomic planes of hcp Co, fcc Ni and fcc Co.

Interfaces between hcp Co and both the zinc blende and wurtzite forms of BN are predicted to be near ideal spin filters for both the p-type and n-type semiconductors. Interfaces between fcc Ni or Co and the wurtzite form of BN are also predicted to be near ideal spin filters for both the p-type and n-type semiconductors. However interfaces between the fcc Ni and Co and the zinc blende form of BN should provide near-ideal spin filters for p-type BN but not for n-type BN.

EXAMPLE 5

A monolayer of hexagonal boron nitride grown on (111) surfaces of fcc Ni or fcc Co or on the (001) surface of hcp Co and in atomic registration with both the ferromagnetic material and the semiconductor may be used to enhance the ordering of the interface between the ferromagnetic material and a semiconductor. A h—BN layer may be provided, for example, in the interface between the ferromagnetic materials and semiconductor materials of Example 1 or 2. A h—BN monolayer is chemically quite inert and may help to prevent degradation caused by chemical reaction or intermixing between the semiconductor and ferromagnetic materials. h—BN is known to grow well on (111) surfaces of fcc Ni and could be expected to grow well on (001) surfaces of hcp Co or (111) surfaces of fcc Co.

EXAMPLE 6
Strained Germanium (111) Film with Co or Ni n-type or p-type Ge in the form of thin, highly strained films whose (111) face is in atomic registry with a (001) face of hcp Co or a (111) face of fcc Ni or fcc Co may be used as a spin filter. In this case the tensile in-plane strain experienced by the Ge lifts the degeneracy between its conduction band minima and the lowest conduction band minimum (at L in the [111] direction) then satisfies the wave vector selection rule criteria. The valence band maximum at the zone center would similarly be split by the in-plane strain.

EXAMPLE 7
$CoS_2$ as a Ferromagnetic Material

Figure 4:
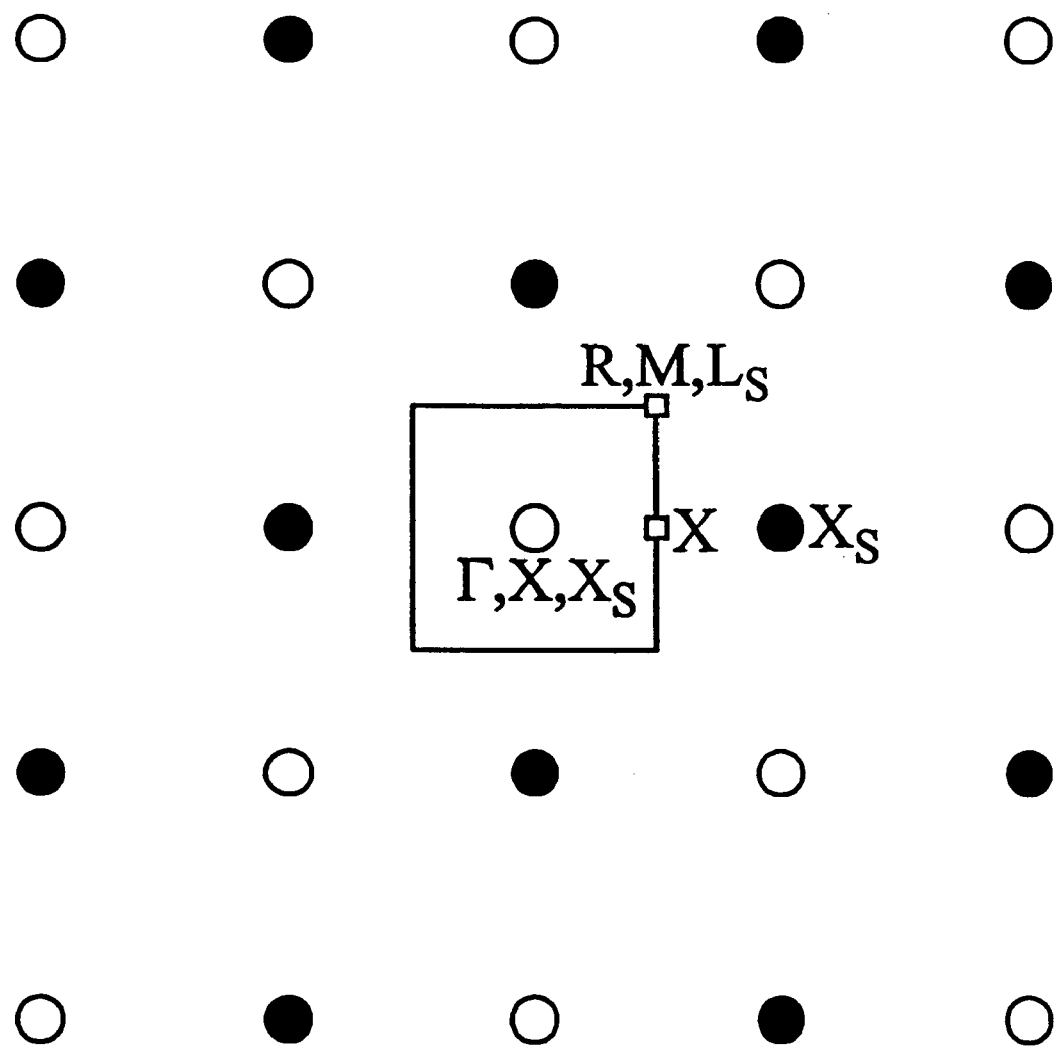

The above examples all involve hcp Co, fcc Ni or fcc Co as a ferromagnetic material. Another ferromagnetic metal suitable for use in this invention is $CoS_2$ which has a simple cubic Bravais lattice with a lattice parameter a=5.407 Å. The lattice parameters of several semiconductors with the zinc blende and diamond crystal structures have values very close to this. Accurate lattice matching at interfaces between (001) crystal planes of those semiconductors and a (001) plane of $CoS_2$ is possible. FIG. 4 shows as circles the projections onto a (001) interface plane of the reciprocal lattice vectors of $CoS_2$. Projections onto the same plane of the reciprocal lattice vectors of a semiconductor with the zinc blende or diamond crystal structure are represented as open circles. The crystal structures of the semiconductor and $CoS_2$ are exactly lattice-matched at the interface.

The square in FIG. 4 is the projection of the first Brillouin zone of $CoS_2$ onto the interface. $X_S$ and $L_S$ denote projections of some X and L points of the semiconductor's Brillouin zone onto the interface plane. X, R and M denote projections of the respective points of the $CoS_2$ Brillouin zone onto the interface plane. Band structure calculations (see, for example, G. L. Zhao et al. Phys. Rev. B48 15781, (1993))indicate that the projection of the majority electron Fermi surface of $CoS_2$ onto the (001) plane occupies most of the projection of the first Brillouin zone onto the (001) plane except in the immediate vicinity of the corners of the square, whereas the projection of the minority Fermi surface of $CoS_2$ forms diagonal cross-shaped regions centered on the corner points R. Thus for a semiconductor whose Fermi surface is at the center of the Brillouin zone or at or near the zone boundary point X, only majority spin band electrons are transmitted at the Fermi energy from $CoS_2$ into the semiconductor through the lattice matched (001) interface.

For a semiconductor whose Fermi surface is at or near the zone boundary point L, only minority spin band electrons are transmitted at the Fermi energy from $CoS_2$ into the semiconductor through the lattice matched (001) interface. Thus suitable semiconductors with the zinc blende or diamond structures whose lattice parameters match $CoS_2$ at a (001) interface may be used with $CoS_2$ to provide spin filters whether they have direct or indirect band gaps.

Some examples of semiconductors with the zinc blende or diamond structures that approximately lattice-match $CoS_2$ in the above sense at a (001) interface (and thus may be used as spin filters with $CoS_2$) are listed in Table III. The name of the semiconductor is followed by the ratio ap/a of the value ap of the lattice parameter required for a perfect match to $CoS_2$, to the actual value a of the lattice parameter for the semiconductor.

TABLE III

Semiconductors useful with $CoS_2$

| Name | match to $CoS_2$ | Name | match to $CoS_2$ |
| --- | --- | --- | --- |
| CuCl | 1.000 | ZnS | 0.999 |
| Si | 0.996 | GaP | 0.993 |
| AlP | 0.989 | AlAs | 0.959 |
| Ge | 0.956 | GaAs | 0.956 |
| ZnSe | 0.954 | CuBr | 0.950 |
| CdS | 0.928 | InP | 0.921 |

The technologically important semiconductor Si has a lattice parameter which permits very good matching to $CoS_2$. The matching may be improved by alloying the Si with a small amount of carbon or working with thin films and a slightly strained interface.

EXAMPLE 8
FeAl or τ-MnAl as a Ferromagnetic Material

Both FeAl and τ-MnAl have property Γ which is necessary but not sufficient for a ferromagnetic metal to be an ideal spin filter in conjunction with a semiconductor whose Fermi surface is close to the center of the Brillouin zone. FeAl is a cubic material and has property Γ for (110) interfaces. Its lattice parameter is close to one-half of those of several semiconductors with zinc blende or diamond crystal structures so that a good lattice match between FeAl and those semiconductors at a (110) interface is possible.

τ-MnAl has a tetragonal structure and its lattice parameter in the planes with four-fold symmetry is also close to one half of those of some semiconductors with zinc blende and diamond crystal structures. A good lattice match between τ-MnAl and (001) faces of those semiconductors is possible. τ-MnAl has property Γ in such interfaces.

The Fermi surfaces of τ-MnAl and FeAl are not currently well enough understood to predict whether these materials will be useful as near-ideal spin filters.

EXAMPLE 9
Gd or Tb as Ferromagnetic Material

Gd and Tb are ferromagnetic metals with the hcp structure. Their lattice parameters in the (001) basal plane (which has hexagonal symmetry) are 3.336 Å and 3.6055 Å respectively. These lattice parameters match approximately the hexagonal planes of several semiconductors with the zinc blende, diamond or wurtzite structures. The Fermi surfaces of Gd and Tb are still not completely understood. Fermi surface calculations of Ahuja et al. (Phys. Rev. B50, 5147 (1994)) suggest that Gd and Tb have property Γ for both minority and majority electrons and the (001) interface plane, but that only the Fermi surface for the majority spin electrons is present at high symmetry lines UK, KM and LM on the Brillouin zone boundary. Based on this, semiconductors lattice matched as above and having Fermi surfaces that project onto the interface plane near the edges of the projection of the Brillouin zones of Gd and Tb may provide near-ideal spin filters in combination with Gd and Tb. Some examples of semiconductors which may be suitable are listed in Table IV.

TABLE IV

Semiconductors for use with Gd or Tb

| Name | Match to Gd | Match to Tb |
|------|-------------|-------------|
| Si   | 0.946       | 0.939       |
| AlP  | 0.940       | 0.933       |
| GaP  | 0.943       | 0.936       |
| BAs  | 1.076       | 1.067       |

The matching between Gd and Tb and the semiconductors of Table IV is only fair but may be improved in strained epitaxial thin films or by semiconductor alloying.

As will be apparent to those skilled in the art in the light of the foregoing disclosure, many alterations and modifications are possible in the practice of this invention without departing from the spirit or scope thereof. For example:

the interface between the semiconductor and ferromagnetic metal may contain one or more intermediate ordered layers of atoms that are not a part of the semiconductor crystal or of the ferromagnetic material. These layers may differ from the semiconductor crystal and from the ferromagnetic metal crystal in the types of the atoms that they contain and/or the precise positioning of those atoms.

Accordingly, the scope of the invention is to be construed in accordance with the substance defined by the following claims.

What is claimed is:

1. A spintronic device comprising:
    a) a ferromagnetic material having Fermi surfaces for electrons in first and second spin states and a crystal structure;
    b) a semiconductor material having a Fermi surface and a crystal structure;
    c) an interface at which the ferromagnetic material and the semiconductor material are in atomic registration;
wherein the crystal structures of the ferromagnetic material and the semiconductor material are oriented so that, for electrons in the first spin state, the Fermi surface for electrons in the first spin state in the ferromagnetic material is not connected to the Fermi surface of the semiconductor material by any sum of:
    d) projections onto the interface of reciprocal lattice vectors of the ferromagnetic material;
    e) projections onto the interface of reciprocal lattice vectors of the semiconductor material; and,
    f) reciprocal lattice vectors associated with the group of symmetry translations in the interface of a system comprising the semiconductor material and the ferromagnetic material.

2. A spintronic device comprising:
    a) a ferromagnetic material having Fermi surfaces for electrons in first and/or second spin states and a crystal structure;
    b) a semiconductor material having a Fermi surface and a crystal structure;
    c) an interface at which the ferromagnetic material and the semiconductor material are in atomic registration;
wherein the crystal structures of the ferromagnetic material and the semiconductor material are oriented such that electrons in the first spin state can scatter from a Fermi surface of the ferromagnetic material across the interface to the Fermi surface of the semiconductor material with a much greater probability than electrons in the second spin state can scatter from a Fermi surface of the ferromagnetic material across the interface to the Fermi surface of the semiconductor material.

3. A spintronic device comprising:
    a) a crystalline first semiconductor;
    b) a crystalline ferromagnetic material in atomic registration with the first semiconductor at an interface;
wherein, transmission of charge carriers in a first spin state from the ferromagnetic material into the first semiconductor is quantum mechanically forbidden while the transmission of charge carriers in a second spin state from the ferromagnetic material into the first semiconductor is quantum mechanically permitted.

4. The device of claim 3 wherein the first semiconductor is an n-type semiconductor, the charge carriers are electrons in the semiconductor and a projection of a Fermi surface of majority spin electrons in the ferromagnetic material is not connected to a projection of any wave vector of a lowest conduction band minimum of the first semiconductor by the projection onto the interface of any sum of reciprocal lattice vectors of the first semiconductor, the ferromagnetic material or the first semiconductor and ferromagnetic material taken together.

5. The device of claim 3 wherein the first semiconductor is a p-type semiconductor, the charge carriers are holes in the semiconductor and a projection of a Fermi surface of majority spin electrons in the ferromagnetic material is not connected to a projection onto the interface of any wave vector of a valence band maximum of the first semiconductor by the projection of any sum of reciprocal lattice vectors of the first semiconductor, the ferromagnetic material or the first semiconductor and ferromagnetic material taken together.

6. The device of claim 3 wherein the first semiconductor is an n-type semiconductor, the charge carriers are electrons in the semiconductor and a projection of a Fermi surface of minority spin electrons in the ferromagnetic material is not connected to a projection of any wave vector of a lowest conduction band minimum of the first semiconductor by the projection of any sum of reciprocal lattice vectors of the first semiconductor, the ferromagnetic material or the first semiconductor and ferromagnetic material taken together.

7. The device of claim 3 wherein the first semiconductor is a p-type semiconductor, the charge carriers are holes in the semiconductor and a projection of a Fermi surface of minority spin electrons in the ferromagnetic material is not connected to a projection of any wave vector of a valence band maximum of the first semiconductor by the projection of any sum of reciprocal lattice vectors of the first semiconductor, the ferromagnetic material or the first semiconductor and ferromagnetic material taken together.

8. The spintronic device of claim 3 comprising a source of electrical potential connected to bias the charge carriers to flow across the interface.

9. The spintronic device of claim 3 comprising one or more atomic layers of a material different from the ferromagnetic material and the first semiconductor in the interface between the ferromagnetic material and the first semiconductor, the layers including atoms in atomic registration with the ferromagnetic material and atoms in atomic registration with the first semiconductor.

10. The spintronic device of claim 9 wherein the material different from the ferromagnetic material comprises h—BN.

11. The spintronic device of claim 10 wherein the semiconductor material is selected from the group consisting of ZnTe, GaSb, InAs, CdSe, CuI, InP, InSb, CdTe, CdS, ZnSe, GaAs, and AlSb.

12. The spintronic device of claim 11 wherein the ferromagnetic material is selected from the group consisting of hcp Co, fcc Co and fcc Ni.

13. The spintronic device of claim 3 wherein the ferromagnetic material and the first semiconductor have mismatched lattice parameters, and one of the ferromagnetic material and the first semiconductor comprises a strained thin layer wherein, at the interface, the ferromagnetic material and the first semiconductor are in atomic registry.

14. The spintronic device of claim 3 wherein the first semiconductor comprises a direct-gap semiconductor.

15. The spintronic device of claim 3 wherein the first semiconductor comprises an n-type semiconductor having a conduction band minimum at k=0.

16. The spintronic device of claim 3 wherein the first semiconductor comprises a p-type semiconductor having a valence band maximum at k=0.

17. The spintronic device of claim 3 wherein the ferromagnetic material is selected from the group consisting of hcp Co, fcc Co and fcc Ni.

18. The spintronic device of claim 17 wherein the first semiconductor has a structure selected from the group consisting of diamond, wurtzite and zinc blende structures.

19. The spintronic device of claim 18 wherein a ratio of an in-plane atomic spacing of the ferromagnetic material to an in-plane atomic spacing of the first semiconductor is about $1:\sqrt{3}$ and a Bravais lattice of the ferromagnetic material is rotated about an axis perpendicular to the interface by an angle relative to a Bravais lattice of the first semiconductor.

20. The spintronic device of claim 19 wherein the angle is 30°.

21. The spintronic device of claim 18 wherein the first semiconductor is selected from the group consisting of ZnTe, GaSb, InAs, CdSe, CuI, InP, InSb, CdTe, CdS, ZnSe, GaAs, and AlSb.

22. The spintronic device of claim 21 wherein the first semiconductor has a hexagonal crystal plane in the plane of the interface.

23. The spintronic device of claim 17 wherein the first semiconductor comprises boron nitride.

24. The spintronic device of claim 23 wherein the boron nitride has a hexagonal structure.

25. The spintronic device of claim 24 wherein the boron nitride is oriented with a hexagonal basal crystallographic plane parallel to a plane of the interface.

26. The spintronic device of claim 23 wherein the boron nitride has a crystal structure selected from the group consisting of zinc blende and wurtzite crystal structures.

27. The spintronic device of claim 26 wherein the first semiconductor has a crystal structure selected from the group consisting of zinc blende and diamond.

28. The spintronic device of claim 27 wherein the first semiconductor is oriented with an (001) crystallographic plane parallel to a plane of the interface.

29. The spintronic device of claim 17 wherein the first semiconductor comprises a thin strained film of Ge having a (111) face in atomic registry with a face selected from the group consisting of: a (001) face of hcp Co, a (111) face of fcc Ni and a (111) face of fcc Co.

30. The spintronic device of claim 3 wherein the first semiconductor is selected from the group consisting of ZnTe, GaSb, InAs, CdSe, CuI, InP, InSb, CdTe, CdS, ZnSe, GaAs, and AlSb.

31. The spintronic device of claim 30 wherein the first semiconductor has a hexagonal crystal plane in the plane of the interface.

32. The spintronic device of claim 3 wherein the first semiconductor comprises boron nitride.

33. The spintronic device of claim 3 wherein the ferromagnetic material comprises $CoS_2$.

34. The spintronic device of claim 33 wherein the first semiconductor is selected from the group consisting of CuCl, ZnS, Si, GaP, AlP, AlAs, Ge, GaAs, ZnSe, CuBr, CdS, and InP.

35. The spintronic device of claim 33 wherein the second semiconductor comprises a doped Si material.

36. The spintronic device of claim 3 wherein the ferromagnetic material comprises a material selected from the group consisting of Fe Al, and τ-MnAl.

37. The spintronic device of claim 36 wherein the ferromagnetic material comprises FeAl and the first semiconductor material is oriented with a (110) crystallographic plane parallel to a plane of the interface.

38. The spintronic device of claim 36 wherein the ferromagnetic material comprises τ-MnAl and the first semiconductor material has a zinc blende or wurtzite crystal structure oriented with a (001) crystallographic plane parallel to a plane of the interface.

39. The spintronic device of claim 3 wherein the ferromagnetic material comprises a material selected from the group consisting of hcp Gd and hcp Tb.

40. The spintronic device of claim 3 comprising a second semiconductor in electrical contact with the first semiconductor wherein a current of spin-polarized electrons flows from the first semiconductor into the second semiconductor.

41. The spintronic device of claim 3 wherein the device is a spin-valve transistor comprising a layer of semiconductor material lying between two layers of ferromagnetic material.

42. The spintronic device of claim 3 wherein the device is a spin-valve transistor comprising a layer of semiconductor material, a first region of a ferromagnetic material in contact with the layer of semiconductor material at a first interface and a second region of a ferromagnetic material in contact with the layer of semiconductor material at a second interface.

43. The spintronic device of claim 3 wherein the first semiconductor is doped with a dopant and the device comprises a region adjacent the interface wherein the first semiconductor is free of dopant.

44. The spintronic device of claim 3 wherein the ferromagnetic material is hcp Co and the interface is orthogonal to a (001) crystallographic axis of the hcp Co.

45. The spintronic device of claim 3 wherein the ferromagnetic material is fcc Ni and the interface is orthogonal to a (111) crystallographic axis of the fcc Ni.

46. The spintronic device of claim 3 wherein the ferromagnetic material is fcc Co and the interface is orthogonal to a (111) crystallographic axis of the fcc Co.

47. A method for injecting a spin-polarized current into a semiconductor comprising:

a) providing a semiconductor crystal in atomic registry with a crystal of a ferromagnetic material at an interface wherein transmission of charge carriers in a first spin state from the ferromagnetic material into the first semiconductor is quantum mechanically forbidden while the transmission of charge carriers in a second spin state from the ferromagnetic material into the first semiconductor is quantum mechanically permitted; and, b) applying a bias voltage across the interface.

* * * * *